(12) United States Patent
Lee et al.

(10) Patent No.: US 7,776,457 B2
(45) Date of Patent: *Aug. 17, 2010

(54) ORGANIC ELECTROLUMINESCENT DEVICE

(75) Inventors: Jun-Yeob Lee, Suwon-si (KR); Min-Seung Chun, Suwon-si (KR); Yong-Joong Choi, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 1314 days.

This patent is subject to a terminal disclaimer.

(21) Appl. No.: 11/268,477

(22) Filed: Nov. 8, 2005

(65) Prior Publication Data

US 2006/0105201 A1    May 18, 2006

(30) Foreign Application Priority Data

Nov. 12, 2004    (KR) ............... 10-2004-0092637

(51) Int. Cl.
*H01L 51/54* (2006.01)
(52) U.S. Cl. ............... 428/690; 428/917; 313/504; 313/506
(58) Field of Classification Search ............... None
See application file for complete search history.

(56) References Cited

U.S. PATENT DOCUMENTS

| | | | |
|---|---|---|---|
| 6,097,147 A | 8/2000 | Baldo et al. | |
| 6,303,238 B1 | 10/2001 | Thompson et al. | |
| 6,310,360 B1 | 10/2001 | Forrest et al. | |
| 2002/0125818 A1* | 9/2002 | Sato et al. ............... | 313/504 |
| 2005/0057150 A1* | 3/2005 | Kim et al. ............... | 313/504 |
| 2005/0233166 A1* | 10/2005 | Ricks et al. ............... | 428/690 |

FOREIGN PATENT DOCUMENTS

| | | |
|---|---|---|
| JP | 10-055888 | 2/1998 |
| JP | 11-003782 | 1/1999 |
| JP | 2000-036386 | 2/2000 |
| JP | 2000-208254 | 7/2000 |
| JP | 2003-007467 | 1/2003 |
| JP | 2005-174639 | 6/2005 |
| WO | 03-094578 | 11/2003 |
| WO | 2004-047196 | 6/2004 |

OTHER PUBLICATIONS

Chinese Office Action dated Feb. 6, 2009 in Applicant's corresponding Chinese application No. 200510117757.X.
Japanese Office Action issued on Sep. 2, 2008 to the corresponding Japanese Patent Application No. 2005-169945.

* cited by examiner

*Primary Examiner*—Marie R. Yamnitzky
(74) *Attorney, Agent, or Firm*—Robert E. Bushnell, Esq.

(57) ABSTRACT

An organic electroluminescent (EL) device which has a light emitting layer composed of at least one phosphorescent dopant disposed between a first electrode and a second electrode; and a blue light emitting layer contacting the light emitting layer, wherein the light emitting layer has a hole transport material and an electron transport material as a host.

20 Claims, 3 Drawing Sheets

ORGANIC ELECTROLUMINESCENT DEVICE

CLAIM OF PRIORITY

This application claims the benefit of Korean Patent Application No. 10-2004-0092637, filed on Nov. 12, 2004, in the Korean Intellectual Property Office, the disclosure of which is incorporated herein in its entirety by reference.

BACKGROUND OF THE INVENTION

1. Field of the Invention

The present invention relates to an organic electroluminescent (EL) device, and more particularly, to an organic EL device including a blue light emitting layer which contacts red and green light emitting layers.

2. Description of the Related Art

Organic EL devices typically comprise a plurality of layers, such as a first electrode, a second electrode, a hole injection layer, a hole transport layer, a light emitting layer, an electron transport layer, an electron injection layer, etc. Organic EL devices may be produced using a polymer material or a small molecule material. In a small molecule organic EL device, layers are formed by vacuum deposition. In a polymer organic EL device, light emitting elements are formed by spin coating.

The small molecule organic EL device may be obtained by forming an organic multi-layer including, for example, a hole injection layer, a hole transport layer, a light emitting layer, a hole blocking layer, an electron injection layer, etc. on a substrate using deposition, and forming a cathode on the organic multi-layer.

When manufacturing such a small molecule organic EL device, a hole injection layer and a hole transport layer are deposited, and then, R, G, and B regions electrically connected to the hole injection layer and the hole transport layer are each deposited using a shadow mask and patterned. Next, a hole blocking layer and an electron injection layer electrically contacting the R, G, and B regions are sequentially deposited on the resultant structure, and then, a cathode is deposited on the electron injection layer.

In the small molecule organic EL device, a fluorescent element or a phosphorescent element can be obtained by forming layers using vacuum deposition. However, when producing a full-color element, the layers are deposited using a mask, which prevents efficient mass production (see U.S. Pat. Nos. 6,310,360, 6,303,238, and 6,097,147).

In a polymer organic EL device, when red, green, and blue polymer layers are patterned using inkjetting or laser induced thermal imaging (LITI), light emitting efficiency, and lifetime may be decreased.

Thus, to manufacture organic EL devices according to a conventional method, R, G, and B must be separately micro-patterned, which is a limit to the efficiency of processes in all the methods of manufacturing organic EL devices.

When a red region (R), a green region (G), and a blue region (B) are formed in a pixel region according to a conventional method of manufacturing organic EL devices, pattering must be performed at least three times through deposition or transferring and the R, G, and B must be micro-patterned, and thus, misalignment may occur. Further, since holes moves faster than electrons in the pixel region, the hole blocking layer must be formed on the light emitting layer to prevent hole transfer. That is, a further process of forming the hole blocking layer is required.

SUMMARY OF THE INVENTION

The present invention provides an organic electroluminescent (EL) device having a blue light emitting layer coated to contact red and green light emitting layers. For this, the light emitting layers comprise a hole transport material and an electron transport material as a host material.

According to an aspect of the present invention, there is provided an organic electroluminescent (EL) device comprising a first electrode and a second electrode; and a light emitting layer disposed between the first electrode and the second electrode, the light emitting layer comprising: a first light emitting layer and a second light emitting layer, a portion of the second light emitting layer extending continuously over the entire the first light emitting layer so as to contact the entire first light emitting layer, the first light emitting layer comprising a host material and at least one phosphorescent dopant, the host material comprising a hole transport material and an electron transport material.

According to an aspect of the present invention, there is provided an organic electroluminescent (EL) device comprising a substrate; a first electrode on the substrate, the first electrode defining a pixel region comprising a red pixel region, a green pixel region and a blue pixel region; a light emitting layer comprising a red light emitting layer, a green light emitting layer and a blue light emitting layer, the red light emitting layer and the blue light emitting layer formed in the red pixel region, the green light emitting layer and the blue light emitting layer formed in the green pixel region, the blue light emitting layer formed in the blue pixel region and extended to the red and green light emitting layers, the red and green light emitting layers comprising a hole transport material and an electron transport material as a host material; and a second electrode over the blue light emitting layer.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
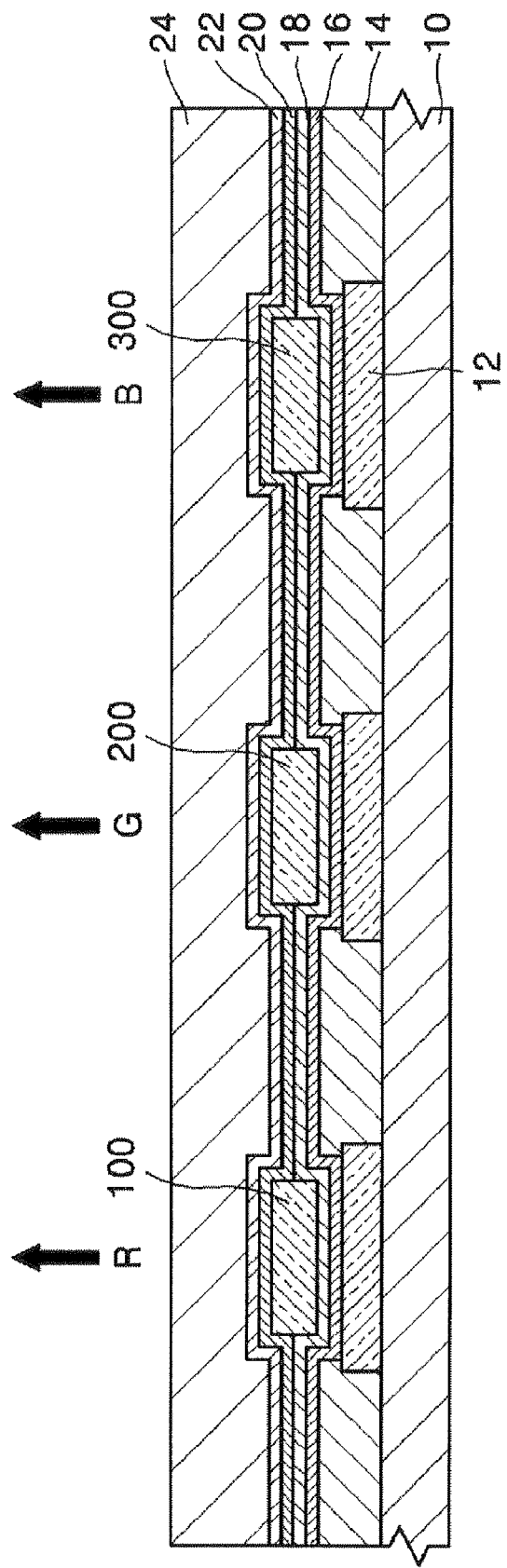
FIG. 1 is a cross-sectional view of a conventional organic EL device.

FIG. 1 is a cross-sectional view of a conventional organic EL device.

Referring to FIG. 1, an anode 12 is deposited on a substrate 10 and patterned. The anode 12 defines a pixel region. Then, an insulating layer 14 exposing the pixel region is formed, and a hole injection layer 16 and/or a hole transport layer 18, which are made of organic materials, are coated on the anode 12 and the insulating layer 14 using, for example, vacuum deposition. That is, the hole injection layer 16 and/or the hole transport layer 18 contact a red region (R) 100, a green region (G) 200, and a blue region (B) 300, which are formed later. Then, the R 100, G 200, and B 300 are formed on the hole injection layer 16 and/or the hole transport layer 18 using vacuum deposition, spin coating, or LITI. When the vacuum deposition method is used, a shadow mask is used to pattern the R 100, G 200, and B 300. In the LITI method, materials are transferred only to desired regions through laser scanning, and thus, a shadow mask is not required.

Next, a hole blocking layer 20 and/or an electron transport layer 22 are coated on the resultant structure to contact the R 100, G 200, and B 300, and then, a cathode 24, which is an upper electrode, is coated thereon.

When the R 100, G 200, and B 300 are formed in the pixel region according to the conventional method, patterning must be performed at least three times through deposition or transferring, and the R 100, G 200, and B 300 must be micropatterned, and thus, misalignment may occur. Further, since holes moves faster than electrons in the pixel region, the hole blocking layer 20 must be formed on the light emitting layer to prevent hole transfer. That is, a further process of forming the hole blocking layer is required.

Hereinafter, the present invention will be described in more detail with reference to the attached drawings.

In an organic electroluminescent (EL) device according to an embodiment of the present invention, the organic electroluminescent (EL) device has a light emitting layer which has a hole transport material and an electron transport material as a host material. The light emitting layer may be a red light emitting layer or a green light emitting layer.

A hole transport material used as a host material may have a carbazole-based compound.

The carbazole-based compound may include at least one compound selected from the group consisting of 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4''-tri(N-carbazolyl)triphenylamine, 1,3,5-tri(2-carbazolylphenyl)benzene, 1,3,5-tris(2-carbazolyl-5-methoxyphenyl)benzene, and bis(4-carbazolylphenyl)silane.

The electron transport material used as a host material may include at least one compound selected from the group consisting of an organic metal complex, an oxadiazole compound, a phenanthroline compound, a triazine compound, a triazole compound, and a spirofluorene compound.

The organic metal complex may include at least one compound selected from the group consisting of bis(8-hydroxyquinolato)biphenoxy metal, bis(8-hydroxyquinolato)phenoxy metal, bis(2-methyl-8-hydroxyquinolato)biphenoxy metal, bis(2-methyl-8-hydroxyquinolato)phenoxy metal), bis(2-methyl-8-quinolinolato)(para-phenyl-phenolato) metal, and bis(2-(2-hydroxyphenyl)quinolato) metal, the metal being Al, Zn, Be, or Ga.

Preferably, the organic metal complex is bis(8-hydroxyquinolato)biphenoxy aluminum, bis(8-hydroxyquinolato) phenoxy aluminum, bis(2-methyl-8-hydroxyquinolato)biphenoxy aluminum, bis(2-methyl-8-hydroxyquinolato) phenoxy aluminum, bis(2-(2-hydroxyphenyl)quinolato) zinc, or bis(2-methyl-8-quinolinolato)(para-phenyl-phenolato)aluminum.

The oxadiazole compound may be (4-biphenylyl)-5-(4-tert-butylphenyl)-1,3,4-oxadiazole. The phenanthroline compound may be 2,9-dimethyl-4,7-diphenyl-9,10-phenanthroline. The triazine compound may be 2,4,6-tris(diarylamino)-1,3,5-triazine, 2,4,6-tris(diphenylamino)-1,3,5-triazine, 2,4,6-tricarbazolo-1,3,5-triazine, 2,4,6-tris(N-phenyl-2-naphthylamino)-1,3,5-triazine, 2,4,6-tris(N-phenyl-1-naphthylamino)-1,3,5-triazine, or 2,4,6-trisbiphenyl-1,3,5-triazine. The triazole compound may be 3-phenyl-4-(1'-naphthyl)-5-phenyl-1,2,4-triazole.

The spirofluorene compound may have the following formula 1:

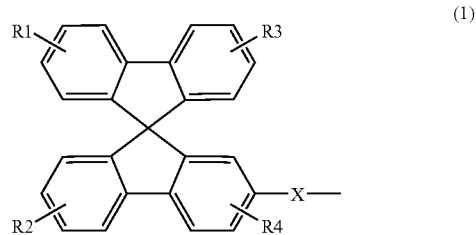

(1)

Wherein R1, R2, R3, and R4 are independently H, a C1-22 alkyl group, an alkoxy group, a CN group, a $NO_2$ group, or —O—Ar, wherein Ar is selected from phenyl, biphenyl, 1-naphthyl, and 2-naphthyl; and X is selected from O, $CR_2$, NR, S, and N=N.

The spirofluorene compound may include at least one compound selected from the group consisting of phenylspirofluorene, biphenylspirofluorene, and methylspirofluorene, but not being limited thereto.

According to an embodiment of the present invention, the phosphorescent dopant used in the red or green light emitting layer may include at least one compound selected from the group consisting of bisthienylpyridine acetylacetonate iridium, bis(benzothienylpyridine)acetylacetonate iridium, bis (2-phenylbenzothiazole)acetylacetonate iridium, bis(1-phenylisoquinoline)iridium acetylacetonate, tris(1-phenylisoquinoline)iridium, and tris(2-phenylpyridine) iridium.

A mixing ratio of the hole transport material and the electron transport material used in the organic EL device according to an embodiment of the present invention may be from 1:9 to 9:1, preferably from 2.5:7.5 to 7.5:2.5. If the mixing ratio is not within the range of 1:9 to 9:1, color mixing between the blue light emitting layer and the red or green light emitting layer may occur.

Each of the red light emitting layer and the green light emitting layer may have a thickness of 100 to 800 Å. If the thickness either of the red light emitting layer or of the green light emitting layer is less than 100 Å, a region in which holes and electrons are recombined to form excitons is narrow, and thus, light emitting efficiency may decrease. If the thickness either of the red light emitting layer or the green light emitting layer is greater than 800 Å, a driving voltage may increase, which is undesirable. The upper limit of 800 Å applies to a conventional light emitting layer. When the light emitting layer is made of a material which has a higher charge transport ability than a conventional light emitting layer, a driving voltage does not greatly increase, and thus, the upper limit can be greater than 800 Å.

The red light emitting layer and the green light emitting layer may be formed using a method selected from the group consisting of vacuum deposition, wet coating, inkjetting, and LITI. When using the vacuum deposition, the red light emitting layer and the green light emitting layer may be micropatterned using a shadow mask. When using spin coating or LITI, patterning with a shadow mask is not required.

After forming the red light emitting layer and the green light emitting layer, a blue light emitting layer is coated as a common layer on the entire surface of the resultant structure.

According to an embodiment of the present invention, the blue light emitting layer may comprise a host material having formula 2:

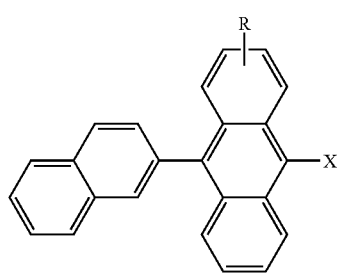

(2)

Wherein R is hydrogen or a substituent having 1 to 20 carbon atoms and being selected from a phenyl derivative, a biphenyl derivative, a naphthyl derivative, and an aryl derivative; and X is a monomer selected from a naphthyl derivative, a biphenyl derivative, a phenylnaphthalene derivative, and a phenylanthracene derivative.

A host material used in the common blue light emitting layer 300 may include at least one compound selected from anthracene dinaphthalene, anthracene dibiphenyl, anthracene naphthalene biphenyl, and anthracene diphenyl.

A concentration of the host material in the blue light emitting layer may be 80 to 99 parts by weight based on 100 parts by weight of the blue light emitting layer. If the concentration of the host material is greater than 99 parts by weight, energy transportation does not occur, thereby decreasing light emitting efficiency. If the concentration of the host material is less than 80 parts by weight, quenching may occur, thereby decreasing light emitting efficiency.

A fluorescent dopant used as a light emitting material in the blue light emitting layer may be a small molecule material selected from the group consisting of DPVBi (4,4'-bis(2,2'-diphenylvinyl)-biphenyl), spiro-DPVBi, spiro-6P (2,2',7,7'-tetrakis(biphenyl-4-yl)-9,9-spirobifluorene (spiro-sexiphenyl)), distyrylbenzene (DSB), and distyrylarylene (DSA), a small molecule material composed of at least two hosts/dopants selected from the group consisting of DPVBi, spiro-DPVBi, spiro-6P, DSB, DSA, and distyrylarylene trivalent amines, or a polymer material selected from a PFO(poly(9, 9-dioctylfluorene))-based polymer and a PPV(poly (p-pheneylene vinylene)-based polymer.

A phosphorescent dopant used in the blue light emitting layer may include at least one compound selected from the group consisting of bis(fluorophenylpyridine)iridium picolinate, bis(difluorophenylpyridine)iridium picolinate, and bis (difluoro cyanophenylpyridine)iridium picolinate, etc.

The blue light emitting layer may have a thickness of 100 to 300 Å. If the thickness is less than 100 Å, the stability of the blue light emitting layer may decrease. If the thickness is greater than 300 Å, a driving voltage may increase.

Figure 3:
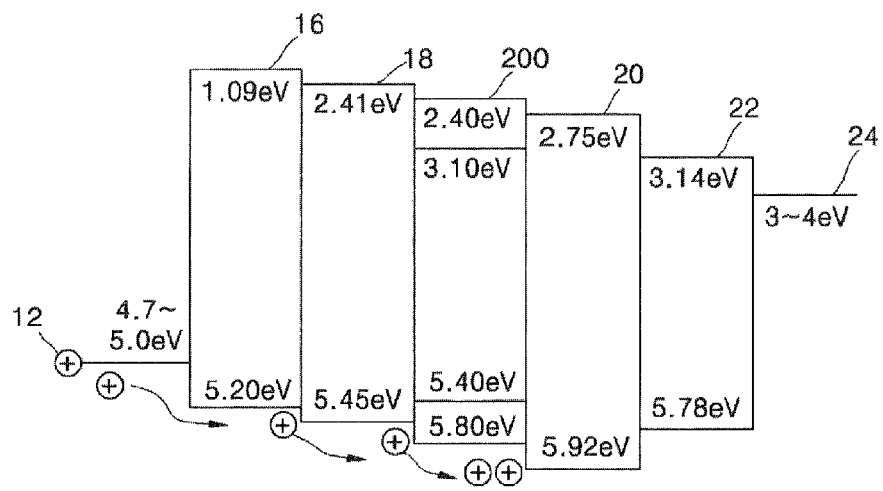
FIG. 3 is an energy band diagram of the respective layers in a conventional organic EL device, in which only a phosphorescent light emitting material is used as a green light emitting material.
Figure 4:
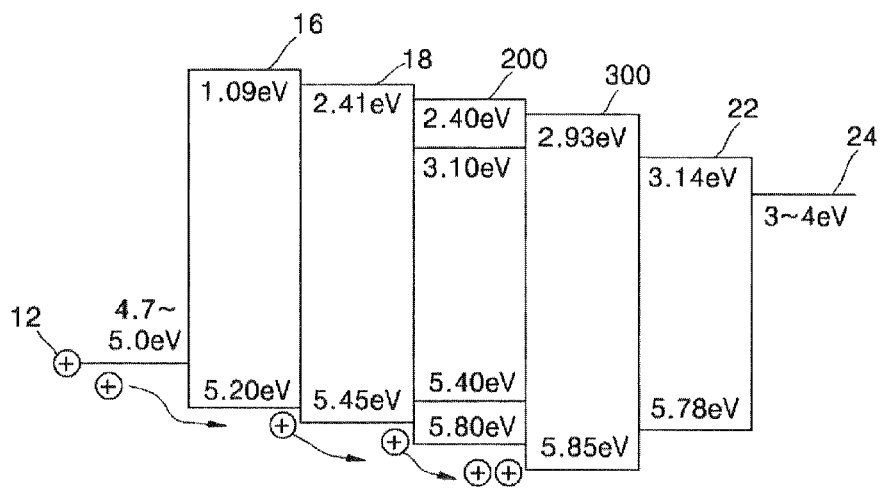
FIG. 4 is an energy band diagram of the respective layers in an organic EL device according to an embodiment of the present invention, in which a phosphorescent light emitting material is used as a green light emitting material, and a blue light emitting layer is formed on the other light emitting layers.

FIG. 3 is an energy band diagram of the respective layers in a conventional organic EL device, in which only a phosphorescent light emitting material is used as a green light emitting material. FIG. 4 is an energy band diagram of the respective layers in an organic EL device according to an embodiment of the present invention, in which a phosphorescent light emitting material is used as a green light emitting material and a blue light emitting layer contacts the green light emitting layer.

In a phosphorescent light emitting device, since a highest occupied molecular orbital (HOMO) value of a green light emitting layer 200 (5.80 eV) is higher than that of an electron transport layer 22 (5.78 eV), holes can be transported from the green light emitting layer 200 to the electron transport layer 22. Thus, excitons, which are generated when the electrons and the holes combine, are not generated in the green light emitting layer 200 as the holes are transported to the electron transport layer 22, thereby deteriorating color purity.

In a fluorescent light emitting device which has a light emitting layer made of a fluorescent light emitting material, the electron transport layer 22 may be formed directly on the light emitting layer. However, in the phosphorescent light emitting device, the hole blocking layer 20 must have a greater HOMO value than the green light emitting layer 200. Referring to FIG. 3, to overcome this requirement, the hole blocking layer 20, which has a HOMO value of 5.92 eV, is conventionally interposed between the green light emitting layer 200 and the electron transport layer 22 to prevent the holes from being transported to the electron transport layer 22, thereby increasing the color purity.

According to an embodiment of the present invention, in order to prevent the holes from being transported to the electron transport layer 22, a blue light emitting layer 300 extends to and contacts a red light emitting layer 100 and a green light emitting layer 200, and the hole blocking layer 20 is not required. A hole injection layer 16 and a hole transport layer 18 are the same as those in the organic EL device illustrated in FIG. 1.

Referring to FIG. 4, the blue light emitting layer 300 is interposed between a green light emitting layer 200 and an electron transport layer 22, and the blue light emitting layer 300 has a HOMO value of 5.85 eV, which is greater than a HOMO value of the green light emitting layer 200, i.e., 5.80 eV, thereby preventing the holes from being transported to the electron transport layer 22. Thus, it is confirmed that the blue light emitting layer 300 has nearly the same effect as the hole blocking layer 20 in FIG. 3. The same effect can be obtained with regard to the red light emitting layer 100. In addition, by using an electron transport material and a hole transport material in the red light emitting layer 100 and the green light emitting layer 200, a light emitting region is closer to the hole transport layer 18, thereby preventing light emission in the common blue light emitting layer 300 in the pixel regions.

Manufacturing of the organic EL device according to the present embodiment will now be described.

Figure 2:
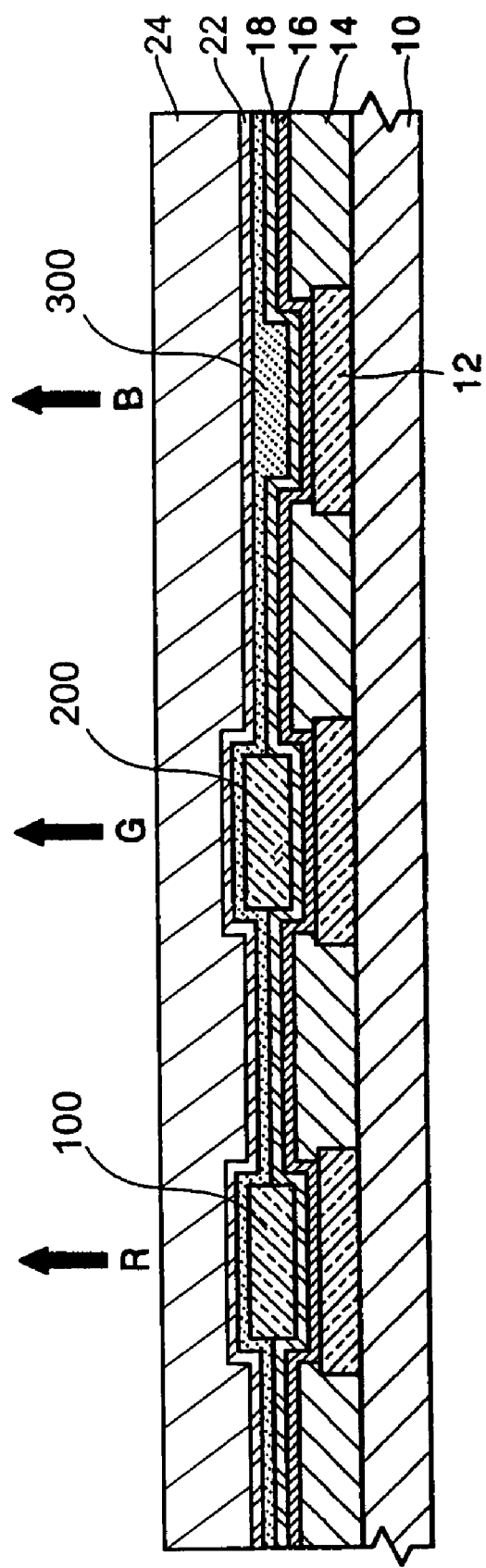
FIG. 2 is a cross-sectional view of an organic EL device according to an embodiment of the present invention.

FIG. 2 is a cross-sectional view of an organic EL device according to an embodiment of the present invention. Referring to FIG. 2, a material for an anode is coated on a substrate 10 to form an anode 12, which is a first electrode.

The substrate 10 may be any substrate used in a conventional organic EL device, and preferably a glass substrate, an organic substrate, or a transparent plastic substrate with excellent transparency, surface smoothness, easy handling, and excellent water resistance.

When the organic EL device is a front emission type device, the anode 12 is a reflective metal layer. When the organic EL device is a rear emission type device, the anode 12 can be composed of one of indium tin oxide (ITO), indium zinc oxide (IZO), tin oxide ($SnO_2$), zinc oxide (ZnO), etc. Then, an insulating layer 14 (pixel defining layer (PDL)) defining a pixel region is formed. Next, a hole injection layer 16 and/or a hole transport layer 18 composed of an organic material are coated on the resultant structure.

The hole injection layer (HIL) 16 may be optionally formed on the anode 12 using vacuum thermal deposition or spin coating. The hole injection layer 16 may be composed of copper phthalocyanine (CuPc) or tarburst type amines, such as TCTA (4,4',4''-Tri(N-carbazolyl)triphenylamine)), and 4,4',4''-Tris(3-methylphenyl-phenylamino)triphenylamine (m-MTDATA), IDE 406 (manufactured by Idemitsu Kosan Co., Ltd.), etc.

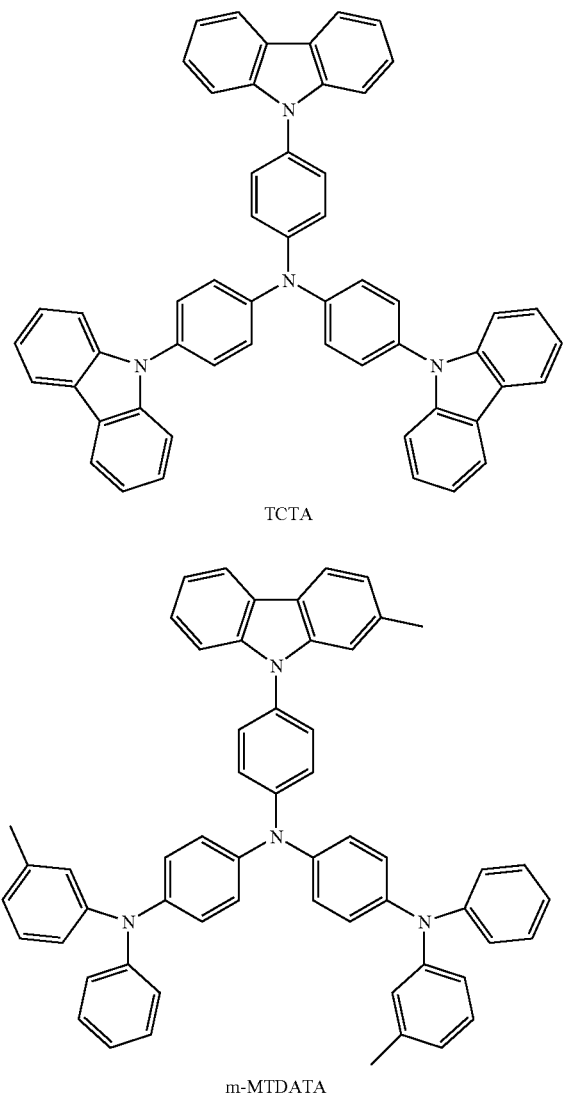

TCTA m-MTDATA

The hole injection layer 16 may have a thickness of 50 to 1500 Å. If the thickness of the hole injection layer 16 is less than 50 Å, hole injection may be insufficient. If the thickness of the hole injection layer 16 is greater than 1500 Å, a driving voltage may increase.

The hole transport layer (HTL) 18 may be optionally formed on the hole injection layer 16 using vacuum thermal deposition or spin coating. The hole transport layer 18 may be composed of N,N'-bis(3-methylphenyl)-N,N'-diphenyl-[1,1-biphenyl]-4,4'-diamine (TPD), N,N'-di(naphthalene-1-yl)-N, N'-diphenyl benzidine, IDE 320 (manufactured by Idemitsu Kosan Co., Ltd.), etc.

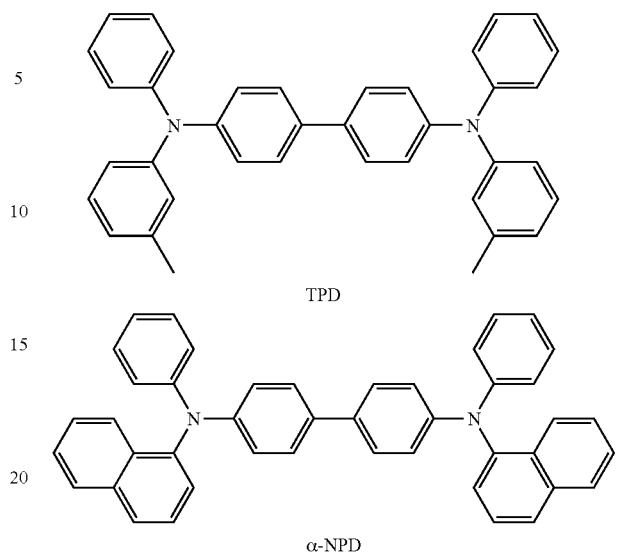

TPD

α-NPD

The hole transport layer 18 may have a thickness of 50-1500 Å. If the thickness of the hole transport layer 18 is less than 50 Å, hole transportation may be insufficient. If the thickness of the hole transport layer 18 is greater than 1500 Å, a driving voltage may increase.

After forming the hole injection layer 16 and/or the hole transport layer 18, a red light emitting material in a red light region (R) 100 and a green light emitting material in a green light region (G) 200 are respectively patterned to obtain light emitting layers which correspond to the pixel regions.

Each of the green and red light emitting materials may be at least two host materials. As described above, the light emitting layers may comprise a phosphorescent host and a fluorescent or phosphorescent dopant, in which a hole transport material and an electron transport material is used as the phosphorescent host. The light emitting layer may be formed using any conventional method, for example, vacuum deposition, inkjet printing, LITI, photolithograph, etc.

The light emitting layer may have a thickness of 100 to 800 Å, preferably 300 to 400 Å. If the thickness of the light emitting layer is less than 100 Å, light emitting efficiency, and lifetime may decrease. If the thickness of the light emitting layer is greater 800 Å, a driving voltage may increase.

After forming the red light emitting layer 100 and the green light emitting layer 200, a blue light emitting material is coated on the resultant structure to obtain a blue light emitting layer 300 as a common layer. Since the blue light emitting layer 300 is coated on the red light emitting layer 100 and the green light emitting layer 200, a separate micro-patterning of a blue light emitting region is not required. Thus, the patterning process in the organic EL device is simplified. In addition, since the blue light emitting material is coated on the entire surface of the resultant structure, the red and green light emitting materials are damaged less, and thus, the organic EL device may have higher stability than a conventional organic EL device.

The thickness of the blue light emitting layer 300 must be determined according to the efficiency of a color coordinate, and may have a thickness of 100 to 300 Å. If the thickness of the blue light emitting layer 300 is less than 100 Å, the effects of forming the blue light emitting layer 300 cannot be obtained. If the thickness of the blue light emitting layer 300 is greater than 300 Å, a driving voltage of the red and green pixels may increase and their color coordinates may be changed.

An electron transport layer 20 is formed on the blue light emitting layer 300 using vacuum deposition or spin coating. The electron transport layer 20 may be made of any conventional material, for example, Alq3. The electron transport layer 20 may have a thickness of 50 to 600 Å. If the thickness of the electron transport layer 20 is less than 50 Å, the lifetime may decrease. If the thickness of the electron transport layer is greater than 600 Å, a driving voltage may increase.

Further, an electron injection layer 22 may be optionally formed on the electron transport layer 20. The electron injection layer 22 may be made of a conventional material, for example, LiF, NaCl, CsF, $Li_2O$, BaO, Liq, etc. The electron injection layer 22 may have a thickness of 1 to 100 Å. If the thickness of the electron injection layer 22 is less than 1 Å, the electron injection layer 22 cannot efficiently function, and thus a driving voltage may increase. If the thickness of the electron injection layer 22 is greater than 100 Å, the electron injection layer 22 functions as an insulating layer, and thus the driving voltage may increase.

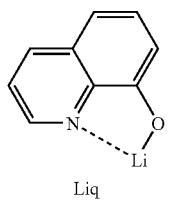

Liq

Next, a cathode 24, which is a second electrode, is formed by coating a metal on the electron injection layer 22 using vacuum thermal deposition, and then encapsulated, thereby completing the organic EL device. The metal of the cathode 24 may be lithium (Li), magnesium (Mg), aluminum (Al), aluminum-lithium (Al—Li), calcium (Ca), magnesium-indium (Mg—In), magnesium-silver (Mg—Ag), etc.

Hereinafter, the present invention will be described in more detail with reference to the following examples. However, these examples are provided for the purpose of illustration and are not intended to limit the scope of the invention.

EXAMPLES

Example 1

A hole injection layer (IDE 406, manufactured by Idemitsu Kosan Co., Ltd.) having a thickness of 30 nm and a hole transport layer (IDE 320, manufactured by Idemitsu Kosan Co., Ltd.) having a thickness of 30 nm were formed on a patterned test cell. Then, a host material composed of 90 parts by weight of 4,4'-N,N'-dicarbazole-biphenyl (CBP) (manufactured by UDC Co., Ltd.,) and 10 parts by weight of BAlq (Aluminum(III) bis(2-methyl-8-quinolinato)4-phenylpheolate), was doped with a dopant, (1-(phenyl)isoquinoline) iridium (III) acetylanetonate [Ir(piq)2acac], with a doping concentration of 10% by weight, and then layered to a thickness of 35 nm on the hole transport layer and patterned using LITI to obtain a phosphorescent light emitting layer. A blue fluorescent light emitting layer composed of IDE 140 (manufactured by Idemitsu Kosan Co., Ltd.) doped with IDE 105 (manufactured by Idemitsu Kosan Co., Ltd.), was formed to a thickness of 10 nm on the entire surface of the resultant structure. Subsequently, an electron transport layer composed of tris(8-hydroxyquinoline) aluminum (Alq3) (manufactured by Nippon Steel Chemical. Co., Ltd.) was formed to a thickness of 20 nm on the blue light emitting layer and a cathode was deposited thereon, and the result was encapsulated with glass, thereby obtaining a complete test cell.

Example 2

An organic EL device was manufactured in the same manner as in Example 1, except that 75 parts by weight of CBP and 25 parts by weight of BAlq were used to form a phosphorescent light emitting layer.

Example 3

An organic EL device was manufactured in the same manner as in Example 1, except that 50 parts by weight of CBP and 50 parts by weight of BAlq were used to form a phosphorescent light emitting layer.

Example 4

An organic EL device was manufactured in the same manner as in Example 1, except that 25 parts by weight of CBP and 75 parts by weight of BAlq were used to form a phosphorescent light emitting layer.

Example 5

An organic EL device was manufactured in the same manner as in Example 1, except that 10 parts by weight of CBP and 90 parts by weight of BAlq were used to form a phosphorescent light emitting layer.

Comparative Example 1

A hole injection layer (IDE 406, manufactured by Idemitsu Kosan Co., Ltd.) having a thickness of 30 nm and a hole transport layer (IDE 320, manufactured by Idemitsu Kosan Co., Ltd.) having a thickness of 30 nm were formed on a patterned test cell. Then, a host material composed of CBP (manufactured by UDC) was doped with a dopant, Ir(piq) 2acac, with a doping concentration of 10% by weight, and then layered to a thickness of 35 nm on the hole transport layer and patterned using LITI to obtain a light emitting layer. Next, a hole blocking layer composed of BAlq (manufactured by UDC) was formed to a thickness of 5 nm on the resultant structure. Subsequently, an electron transport layer composed of Alq3 (manufactured by Nippon Steel Chemical. Co., Ltd.) was formed on the hole injection layer and a cathode was deposited thereon, and the result was encapsulated with glass, thereby obtaining a complete test cell.

Comparative Example 2

An organic EL device was manufactured in the same manner as in Comparative Example 1, except that a host material of a light emitting layer was composed of BAlq.

Comparative Example 3

A hole injection layer (IDE 406, manufactured by Idemitsu Kosan Co., Ltd.) having a thickness of 30 nm and a hole transport layer (IDE 320, manufactured by Idemitsu Kosan Co., Ltd.) having a thickness of 30 nm were formed on a patterned test cell. Then, a host material composed of CBP (manufactured by UDC), was doped with a dopant, $Ir(ppy)_3$, with a doping concentration of 10% by weight, and then layered to a thickness of 35 nm on the hole transport layer and patterned using LITI to obtain a phosphorescent light emitting layer. A blue fluorescent layer composed of IDE 140 (manufactured by Idemitsu Kosan Co., Ltd.) doped with IDE 105 (manufactured by Idemitsu Kosan Co., Ltd.) was formed to a thickness of 10 nm on the entire surface of the resultant structure. Subsequently, an electron transport layer composed of Alq3 (manufactured by Nippon Steel Chemical. Co., Ltd.) was formed to a thickness of 20 nm on the blue light emitting layer and a cathode was deposited thereon, and the result was encapsulated with glass, thereby obtaining a complete test cell.

Comparative Example 4

An organic EL device was manufactured in the same manner as in Comparative Example 3, except that a host material of a phosphorescent light emitting layer was composed of BAlq.

Light emitting efficiencies, color coordinates, and lifetimes of the organic EL devices manufactured in Examples 1-5 and Comparative Example 1-4 were examined. Light emitting efficiencies were measured using a spectrophotometer, and lifetimes were estimated using a photodiode. The results are shown in Table 1.

While light emitting efficiencies of the organic EL devices obtained in Comparative Examples 1-4 were in a range of about 3.1-4.8 cd/A, light emitting efficiencies of the organic EL devices obtained in Example 1-5 were in a range of 5.1-5.9 cd/A, which is about 30% higher than the range obtained in Comparative Examples 1-4.

Compared to color purities of the organic EL devices obtained in Examples 1-5 according to embodiments of the present invention, the organic EL devices obtained in Comparative Example 3 had slightly lower color purities. There were little differences between the color purities of the organic EL devices obtained in the Examples 1-5 and color purities of the organic EL devices obtained in Comparative Examples 1 and 2, which used a single host material in the phosphorescent light emitting layer and comprised the hole blocking layer, and the organic EL device obtained in Comparative Example 4, which used a single host material in the phosphorescent light emitting layer and comprised the common blue light emitting layer without the hole blocking layer.

As used herein, the term "lifetime" refers to time until the initial brightness decreased by 50%. While the lifetimes of the organic EL devices obtained in Examples 1-5 were in a range of 400-600 hours at 1000 cd/m², the lifetimes of the organic EL devices obtained in Comparative Examples 1-4 were in a range of 80 to 150 hours at 1000 cd/m². Thus, it was confirmed that the lifetimes of the organic EL devices obtained in Examples 1-5 were about 200 to 300% longer than the lifetimes of the organic EL devices obtained in Comparative Examples 1-4.

TABLE 1

| | Light emitting efficiency (cd/A) | Color coordinate | Lifetime (hrs) |
|---|---|---|---|
| Example 1 | 5.7 | (0.67, 0.32) | 500 |
| Example 2 | 5.9 | (0.67, 0.32) | 600 |
| Example 3 | 5.5 | (0.67, 0.32) | 500 |
| Example 4 | 5.5 | (0.67, 0.32) | 400 |
| Example 5 | 5.1 | (0.67, 0.32) | 350 |
| Comparative Example 1 | 4.6 | (0.67, 0.32) | 150 |
| Comparative Example 2 | 4.6 | (0.67, 0.32) | 100 |
| Comparative Example 3 | 3.5 | (0.57, 0.34) | 80 |
| Comparative Example 4 | 4.8 | (0.67, 0.32) | 150 |

As describe above, the organic EL device according to the present invention has a structure in which a blue light emitting layer is formed on a phosphorescent light emitting layer comprising a hole transport material and an electron transport material as a host material, thereby providing the following advantages.

First, a hole blocking layer which prevents holes from diffusing into an electron transport layer is not required, and thus, the number of the deposition processes for manufacturing can be reduced.

Second, micro-patterning for forming a blue region is not required, thus further reducing the total number of processes for manufacturing can be reduced.

Third, by using the mixed host material in the red and green light emitting layers, a color mixing phenomenon between the common blue light emitting layer and the red and green light emitting layers can be prevented.

Fourth, the organic EL device has a light emitting efficiency which is 30% higher than that of the conventional organic EL device and a lifetime which is 200% longer than that of the conventional organic EL device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent (EL) device, comprising a first electrode functioning as an anode and a second electrode functioning as a cathode; and light emitting layer disposed between the first electrode and the second electrode, the light emitting layer comprising a first light emitting layer and a second light emitting layer, a portion of the second light emitting layer extending continuously over the entire the first light emitting layer so as to contact the entire first light emitting layer, the first light emitting layer being between the first electrode and the second light emitting layer, the first light emitting layer comprising a host material and at least one phosphorescent dopant, the host material comprising a hole transport material and an electron transport material, the second light emitting layer having a highest occupied molecular orbital (HOMO) value greater than a highest occupied molecular orbital value (HOMO) of the first light emitting layer.

2. The organic electroluminescent device of claim 1, wherein the first light emitting layer is a red light emitting layer or a green light emitting layer, and the second light emitting layer is a blue light emitting layer.

3. The organic electroluminescent device of claim 2, wherein the electron transport material includes at least one compound selected from the group consisting of an organic metal complex, an oxadiazole compound, a phenanthroline compound, a triazine compound, a triazole compound, and a spirofluorene compound.

4. The organic electroluminescent device of claim 3, wherein the organic metal complex includes at least one compound selected from the group consisting of bis(8-hydroxyquinolato)biphenoxy metal, bis(8-hydroxyquinolato)phenoxy metal, bis(2-methyl-8-hydroxyquinolato)biphenoxy metal, bis(2-methyl-8-hydroxyquinolato)phenoxy metal, bis(2-methyl-8-quinolinolato)(para-phenyl-phenolato)metal, and bis(2-(2-hydroxyphenyl)quinolato)metal, the metal of the organic metal complex being Al, Zn, Be, or Ga, the oxadiazole compound is (4-biphenylyl)-5-(4-tert-butylphenyl)-1,3,4-oxadiazole, and the phenanthroline compound is 2,9-dimethyl-4,7-diphenyl-9,10-phenanthroline, the triazine compound is 2,4,6-tris(diarylamino)-1,3,5-triazine, 2,4,6-tris(diphenylamino)-1,3,5-triazine, 2,4,6-tricarbazolo-1,3,5-triazine, 2,4,6-tris(N-phenyl-2-naphthylamino)-1,3,5-triazine, 2,4,6-tris(N-phenyl-2-naphthylamino)-1,3,5-triazine, or 2,4,6-trisbiphenyl-1,3,5-triazine, the triazole compound is 3-phenyl-4-(1'-naphthyl)-5-phenyl-1,2,4-triazole, and the spirofluorene compound includes at least one compound selected from the group consisting of phenylspirofluorene, biphenylspirofluorene, and methylspirofluorene.

5. The organic electroluminescent device of claim 2, wherein the first light emitting layer has a thickness of 100 to 800 Å.

6. The organic electroluminescent device of claim 2, wherein the blue light emitting layer comprises a compound represented by Formula 2 as a host material:

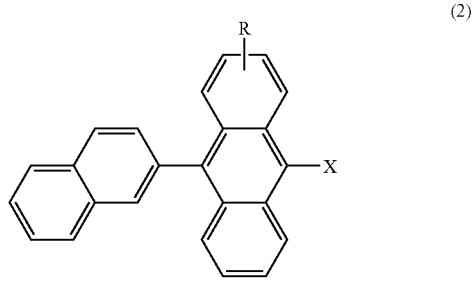

(2)

wherein R is hydrogen or a substituent having 6 to 20 carbon atoms, and the substituent having 6 to 20 carbon atoms is an aryl derivative; and X is a monomer selected from a naphthyl derivative, a biphenyl derivative, a phenylnaphthalene derivative, and a phenylanthracene derivative.

7. The organic electroluminescent device of claim 6, wherein the concentration of the host material in the blue light emitting layer is 80 to 99 parts by weight based on 100 parts by weight of the blue light emitting layer.

8. The organic electroluminescent device of claim 6, wherein R is selected from the group consisting of a phenyl derivative, a biphenyl derivative, and a naphthyl derivative.

9. The organic electroluminescent device of claim 2, wherein the blue light emitting layer comprises a fluorescent dopant comprised of a small molecule material selected from the group consisting of DPVBi, spiro-DPVBi, spiro-6P, distyrylbenzene (DSB), and distyrylarylene (DSA), a small molecule material comprised of at least two materials selected from the group consisting of DPVBi, spiro-DPVBi, Spiro-6P, DSB, DSA, and distyrylarylene trivalent amines, or a polymer material selected from a PFO-based polymer and a PPV-based polymer.

10. The organic electroluminescent device of claim 2, wherein the blue light emitting layer comprises a phosphorescent dopant selected from the group consisting of bis(fluorophenylpyridine)iridium picolinate, bis(difluorophenylpyridine)iridium picolinate, and bis(difluoro cyanophenylpyridine)iridium picolinate.

11. The organic electroluminescent device of claim 2, wherein the blue light emitting layer has a thickness of 100 to 300 Å.

12. The organic electroluminescent device of claim 1, wherein the hole transport material has a carbazole-based compound.

13. The organic electroluminescent device of claim 12, wherein the carbazole-based compound includes at least one compound selected from the group consisting of 1,3,5-tricarbazolylbenzene, 4,4'-biscarbazolylbiphenyl, polyvinylcarbazole, m-scarbazolylphenyl, 4,4'-biscarbazolyl-2,2'-dimethylbiphenyl, 4,4',4''-tri(N-carbazolyl)triphenylamine, 1,3,5-tri(2-carbazolylpheny)benzene, 1,3,5-tris(2-carbazolyl-5-methoxypheny)benzene, and bis(4-carbazolylphenyl)silane.

14. The organic electroluminescent device of claim 1, wherein the phosphorescent dopant in the first light emitting layer includes at least one compound selected from the group consisting of bis(thienylpyridine)acetylacetonate iridium, bis(benzothienylpyridine)acetylacetonate iridium, bis(2-phenylbenzothiazole)acetylacetonate iridium, bis(1-phenylisoquinoline)iridium acetylacetonate, tris(1-phenylisoquinoline)iridium, and tris(2-phenylpyridine)iridium.

15. The organic electroluminescent device of claim 1, wherein a mixing ratio of the hole transport material and the electron transport material is from 1:9 to 9:1.

16. An organic electroluminescent (EL) device, comprising:
 a substrate;
 a first electrode functioning as an anode on the substrate, the first electrode defining a pixel region comprising a red pixel region, a green pixel region and a blue pixel region;
 a light emitting layer comprising a red light emitting layer formed in the red pixel region, a green light emitting layer formed in the green pixel region and a blue light emitting layer formed in the blue pixel region, the blue light emitting layer extending over the red and green light emitting layers, the red and green light emitting layers comprising a hole transport material and an electron transport material as a host material, the blue light emitting layer having a highest occupied molecular orbital (HOMO) value greater than highest occupied molecular orbital values (HOMO) of the green light emitting layer and the red light emitting layer; and
 a second electrode functioning as a cathode over the blue light emitting layer.

17. The organic electroluminescent device of claim 16, wherein the hole transport material of the red and green light emitting layers comprises a carbazole-based compound, the electron transport material of the red and green light emitting layers comprises at least one compound selected from the group consisting of an organic metal complex, an oxadiazole compound, a phenanthroline compound, a triazine compound, a triazole compound and a spirofluorene compound, and the blue light emitting layer comprises 80 to 99 parts by weight of a host material based on 100 parts by weight of the blue light emitting layer.

18. The organic electroluminescent device of claim 16, wherein a mixing ratio of the hole transport material and the electron transport material is from 1:9 to 9:1.

19. The organic electroluminescent device of claim 16, wherein the blue light emitting layer comprises a compound represented by Formula 2 as a host material:

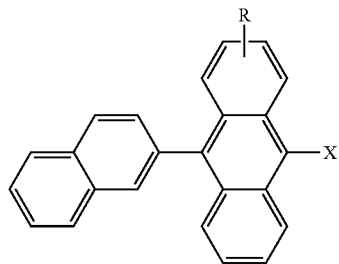

(2)

wherein R is hydrogen or a substituent having 6 to 20 carbon atoms, and the substituent having 6 to 20 carbon atoms is an aryl derivative; and X is a monomer selected from a naphthyl derivative, a biphenyl derivative, a phenylnaphthalene derivative, and a phenylanthracene derivative.

20. The organic electroluminescent device of claim 19, wherein R is selected from the group consisting of a phenyl derivative, a biphenyl derivative, and a naphthyl derivative.

* * * * *